US005134622A

United States Patent [19]

Deacon

[11] Patent Number: 5,134,622
[45] Date of Patent: Jul. 28, 1992

[54] DIODE-PUMPED OPTICAL PARAMETRIC OSCILLATOR

[75] Inventor: David A. G. Deacon, Los Altos, Calif.

[73] Assignee: Deacon Research, Palo Alto, Calif.

[21] Appl. No.: 632,447

[22] Filed: Dec. 20, 1990

[51] Int. Cl.$^5$ .............................................. H01S 3/10
[52] U.S. Cl. ...................................... 372/21; 372/22; 372/31; 372/32; 372/94; 307/424; 359/326; 359/330
[58] Field of Search ....................... 372/21, 22, 18, 20, 372/94, 31, 32; 307/424, 425, 428

[56] References Cited

U.S. PATENT DOCUMENTS

| | | | |
|---|---|---|---|
| 3,628,186 | 12/1971 | Ashkin et al. | 307/428 X |
| 3,644,845 | 2/1972 | Harris | 307/428 X |
| 3,662,183 | 5/1972 | Ashkin et al. | 307/428 |
| 4,180,751 | 12/1979 | Ammann | 307/428 |
| 5,017,806 | 5/1991 | Edelstein | 307/428 |

OTHER PUBLICATIONS

Wu et al., "Squeezed States of Light from an Optical Parametric Oscillator," *J. Opt. Soc. Am. B*, vol. 4, No. 10, (Oct. 1987), pp. 1465–1475.
Grangier et al., "Squeezed-Light-Enhanced Polarization Interferometer," *Phys. Rev. Lett.*, vol. 59, No. 19, pp. 2153–2156, Nov. 9, 1987.
Nabors et al., "Efficient, Single-Axial-Mode Operation of a Monolithic MgO:LiNbO$_3$, Optical Parametric Oscillator," *Opt. Lett.*, vol. 14, No. 20, pp. 1134–1136, Oct. 15, 1989.
Nabors et al., "Coherence Properties of a Doubly-Resonant Monolithic Optical Parametric Oscillator," *Journ. Opt. Soc. Am.*, vol. B7, pp. 815–820 (1990).
Ammann et al., "Efficient Internal Optical Parametric Oscillation", *Appl. Phys. Lett.*, vol. 16, pp. 309–312 (1970).
Oshman et al., "Theory of Optical Parametric Oscillation Internal to the Laser Cavity", *IEEE Journ. Quant. Elect.*, vol. QE-4, pp. 491–502 (1968).
Kozlovsky et al., "Generation of 41 mW of Blue Radiation by Frequency Doubling of a GaAlAs Diode Laser," *Appl. Phys. Lett.*, vol. 56, pp. 2291–2292 (1990).
Hemmerich et al., "Second-Harmonic Generation and Optical Stabilization of a Diode Laser in an External Ring Resonator," *Opt. Lett.*, vol. 15, pp. 372–374 (1990).
Goldberg et al., "Efficient Generation at 421 nm by Resonantly Enhanced Doubling of GaAlAs Laser Diode Array Emission," *Appl. Phys. Lett.*, vol. 55, pp. 218–220 (1989).
Dixon et al., "432 nm Source Based on Efficient Second-Harmonic Generation of GaAlAs Diode-Laser Radiation in a Self-Locking External Resonant Cavity," *Opt. Lett.*, vol. 14, pp. 731–733 (1989).

(List continued on next page.)

*Primary Examiner*—Georgia Y. Epps
*Attorney, Agent, or Firm*—Townsend and Townsend

[57] ABSTRACT

The present invention is an optical parametric oscillator (OPO) which combines a singly resonant oscillator (SRO) configuration with a buildup cavity and uses optical output of a buildup cavity as feedback to injection lock a source laser. The result is an easily tuned OPO with a low pump power threshold without the requirement for active electronic control of the laser and/or the OPO resonator. In particular, specific embodiments of the invention employ a semiconductor diode laser to pump the OPO. The emission from the single longitudinal mode diode laser is transversely mode matched into the buildup cavity where the circulating power can build up to hundreds of times the output power of the diode. This high circulating power traverses the OPO crystal at a point of focus, producing a high enough intensity for operation of the OPO. At least one of the generated waves is also resonated in the SRO configuration. Either or both of the generated waves can be made to emerge from the resonator at the desired output mirror for use in applications.

26 Claims, 9 Drawing Sheets

OTHER PUBLICATIONS

R. L. Byer, "Parametric Oscillators and Nonlinear Materials" in Nonlinear Optics, P. G. Harper et al., (eds.), Academic Press, 47–160 (1977).

Hansch et al., "Laser Frequency Stabilization by Polarization Spectroscopy of a Reflecting Reference Cavity," *Opt. Comm.*, vol. 35, pp. 441–444 (1980).

Harper et al., "Nonlinear Optics," *Academic Press*, pp. 47–160 (1977).

Laurent et al., "Frequency Noise Analysis of Optically Self-Locked Diode Lasers," pp. 1131–1142, *IEEE Journ. of Quantum Electronics*, vol. 25, No. 6, Jun. 1989.

Vahala et al., "Semiclassical Theory of Noise in Semiconductor Lasers—Part I," *IEEE Journ. of Quantum Electronics*, vol. QE-19, No. 6, pp. 1096–1101, Jun. 1983.

Giordimaine et al., "Tunable Coherent Parametric Oscillation in $LiNbO_3$ at Optical Frequencies," *Physical Review Lett.*, vol. 14, No. 24, Jun. 14, 1965.

Weller et al., "Time-Resolved Spectral Output of a Doubly Resonant CW Optical Parametric Oscillator," *J. Appl. Phys.*, vol. 43, No. 11, pp. 4650–4652, Nov. 1972.

Smith et al., "Continuous Optical Parametric Oscillation in $Ba_2NaNb_5O_{15}$," *Appl. Physics Lett.*, vol. 12, No. 9, pp. 308–310, May 1, 1968.

Byer et al., "Visible CW Parametric Oscillator," *Appl. Physics Lett.*, vol. 13, No. 3, pp. 109–111, Aug. 1, 1968.

Laurence et al., "Visible CW Parametric Oscillator Using Barium Sodium Niobate," *J. Appl. Phys.*, vol. 42, pp. 2137–2138 (1971).

DIODE-PUMPED OPTICAL PARAMETRIC OSCILLATOR

BACKGROUND OF THE INVENTION

The present invention relates generally to optical amplification and more particularly to excitation of optical parametric oscillators.

An optical parametric oscillator (OPO) is a nonlinear device employing a nonlinear optical resonance phenomenon to convert incident photons into photon pairs when optically excited at a power per unit area above a threshold level, the threshold level being a characteristic of the nonlinear material and the wavelengths. This device is usually practiced in one of two forms: the doubly resonant oscillator (DRO) in which both of the generated optical beams are resonated, or the singly resonant oscillator (SRO) in which only one of the generated optical beams is resonated.

The development of optical parametric oscillators for the commercial market requires the achievement of several simultaneous features. These features include primarily a low pump intensity threshold and output stability. It is desirable to have the capability to drive an OPO by a variety of pump lasers, including in particular small, low power, inexpensive lasers, such as the Helium-Neon (HeNe) laser, the air-cooled Argon ion laser, and the semiconductor diode laser. OPOs pumped with continuous wave (CW) lasers present two central difficulties. Since a high intensity must be used, the first problem has been that a costly, high average power laser is required. The second problem is that the pump laser frequency must be extremely well controlled to obtain a stable continuous output. While high stability has been achieved in some laboratory laser systems, technical advances are needed which both reduce the required pump laser average power and satisfy the stability requirements for a feasible commercial system.

In the experimental literature beginning with the invention of the OPO, four experimental groups report working on continuous OPOs through 1974. These groups are from Bell Labs, from Stanford, from Rice, and from Karlsruhe. In none of this work was true continuous operation achieved because there was high sensitivity of the configuration to frequency fluctuations.

Interest was revived in CW OPOs in 1987 when two groups used triply resonant OPOs for quantum "squeezed state" experiments: L-A. Wu et al. "Squeezed states of light from an optical parametric oscillator", *J. Opt. Soc. Am.*, Vol. 4, No. 10, pp. 1465-1475 (1987), and P. Grangier et al, "Squeezed-light-enhanced polarization interferometer", *Phys. Rev. Lett.*, Vol 59, No. 19, pp. 2153-2156 (1987). The triply resonant OPO is a DRO with the addition of a buildup cavity to increase the intensity of the source laser at the OPO crystal. Using this approach, operation was possible with pump laser average powers of 30 mW and 150 mW, respectively. To achieve this buildup, extensive stabilization measures were taken. The Wu et al. laser was locked with a broadband electronic stabilization system to an external Fabry-Perot resonator. Both groups then had to stabilize the length of the OPO resonator to the fluctuating output of the pump laser in order to excite the triply resonant OPO. Neither group was particularly sensitive to the instability in the power generated by the OPO (the first group even worked below the OPO threshold).

In 1989, Nabors et al. showed that the pulsing problems of CW OPOs can be solved by using the highly stable nonplanar ring YAG laser as the pump (C. D. Nabors et al., "Efficient, single-axial-mode operation of a monolithic $MgO:LiNbO_3$ optical parametric oscillator", *Opt. Lett.*, Vol. 14, No. 20, pp. 1134-1136 (1989); and C. D. Nabors et al., "Coherence properties of a doubly-resonant monolithic optical parametric oscillator", *Journ. Opt. Soc. Am.*, Vol. B7, pp. 815-820 (1990)). In order to reach threshold with the available pump power, they selected the doubly resonant oscillator (DRO) configuration in which both the signal and the idler waves are enhanced by a resonant cavity surrounding the nonlinear crystal of the OPO. Since the DRO has a substantially lower threshold than the SRO, they were able to obtain oscillation.

Both of these approaches were doubly resonant oscillators. However, the preferred configuration from the point of view of a user is the singly resonant OPO because of its capability for smooth tuning. The doubly resonant oscillator has a tuning problem because all three of the interacting waves have a defined longitudinal mode structure, leading to an over-constrained system. The pump wave longitudinal mode structure is defined by the pump laser cavity. Both the signal and the idler wave longitudinal mode structures are defined by the OPO resonant cavity. The result of this situation is that the DRO cannot be tuned without mode hops which depend on the temperature of the crystal and the length of the cavity. These hops can be unacceptably large. In the SRO configuration, only one of the signal beam or the idler beam is resonated, removing the over-constrained condition, and allowing continuous tuning.

Unfortunately, the high threshold of the SRO eliminates from consideration many of the most desirable pump lasers. What is needed is a singly-resonant parametric oscillator capable of being driven stably by a low-powered optical source.

There are other structures which have relevance to the invention described hereinafter. An OPO has been operated inside a resonant cavity of a pump laser. See E. O. Ammann et al., "Efficient internal optical parametric oscillation", *Appl. Phys. Lett.*, Vol. 16, pp. 309-312 (1970). By this means, the pump power at the nonlinear crystal is made larger than the laser output power, as in the approach described hereinafter. However, since there is no external cavity, there is clearly no need for injection locking. The intracavity approach was first analyzed by M. K. Oshman et al., "Theory of Optical Parametric Oscillation internal to the laser cavity", *IEEE Journ. Quant. Elect.*, Vol. QE-4 pp. 491-502 (1968). This approach helps reach threshold for some pump laser types, but it does not address the pulsation instabilities for CW operation, which are caused by frequency instabilities. It is also incompatible with the semiconductor diode laser, since no space is available intracavity, and the cavity Q is so low that no significant improvement would be obtained by applying this approach to the external cavity diode laser. Even for the lasers where this approach is applicable, Oshman et al. have shown that the laser power cannot exceed three times the threshold, or CW operation becomes impossible due to induced instability. This constraint further limits the applicability of the intracavity approach.

Frequency doubling configurations which use the buildup cavity have been described in the following four articles: W. J. Kozlovsky et al., "Generation of 41 mW of blue radiation by frequency doubling of a GaAlAs diode laser", *Appl. Phys Lett.* Vol. 56, pp. 2291-2292 (1990); A. Hemmerich et al., "Seconddiode-harmonic generation and optical stabilization of a laser in an external ring resonator", Opt. Lett. Vol. 15 pp. 372-374 (1990); L. Goldberg et al., "Efficient generation at 421 nm by resonantly enhanced doubling of GaAlAs laser diode array emission", *Appl. Phys. Lett.*, Vol. 55, pp. 218-220 (1989); and G. J. Dixon et al., "432 nm source based on efficient second-harmonic generation of GaAlAs diode-laser radiation in a self-locking external resonant cavity", *Opt. Lett.*, Vol. 14, pp. 731-733 (1989).

All of these approaches used semiconductor diode lasers as the pump source, all of them performed the doubling operation with a resonator to build up the pump laser power and increase the efficiency of the doubling operation, and all employ locking to the source. However, with the object being to double an output frequency, there is no attention paid to the problems of multiple-wavelength mirror reflectivity and transmission, tuning, or three-beam phase matching, which are characteristic of an OPO. Dielectric mirrors are always very close to perfectly anti-reflection coated at the second harmonic of their primary reflection frequency. All of these researchers treat this as an advantage for extracting the second harmonic generated in the doubling crystal. There is no consideration of the needs for additional coatings to achieve the doubly or triply resonant cavity needed for an OPO.

SUMMARY OF THE INVENTION

The present invention is an optical parametric oscillator (OPO) which combines a singly resonant oscillator (SRO) configuration with a buildup cavity and uses optical output of a buildup cavity as feedback to injection lock a source laser. The result is an easily tuned OPO with a low pump power threshold without the requirement for active electronic control of the laser and/or the OPO resonator. In particular, specific embodiments of the invention employ a semiconductor diode laser to pump the OPO. The emission from the single longitudinal mode diode laser is transversely mode matched into the buildup cavity where the circulating power can build up to hundreds of times the output power of the diode. This high circulating power traverses the OPO crystal at a point of focus, producing a high enough intensity for operation of the OPO. At least one of the generated waves is also resonated in the SRO configuration. Either or both of the generated waves can be made to emerge from the resonator at the desired output mirror for use in applications.

Since diode lasers can easily be slaved to a given frequency by injection locking, injection locking is used to control the frequency of the pump laser. A fraction of the optical beam which is built up in the OPO resonator can be coupled out through one of the mirrors and injected back into the pump laser. This causes the emission of the pump laser to concentrate on the frequency of the OPO resonator. Since the injection locking beam has been filtered by the high-Q OPO resonator, its amplitude and phase noise is greatly reduced. Not only does the pump laser automatically tend to follow the OPO resonator frequency, but its bandwidth is automatically narrowed to a fraction of the OPO resonator bandwidth, producing the ideal single longitudinal mode pump beam.

A device having this specific configuration is especially attractive because the dominant frequency control of the source laser is entirely passive. Additional components are needed only to optimize and control the performance. This approach can be used with any laser which can be injection locked.

The total amount of the pump power which is extracted from the buildup cavity must be less than the pump power which flows into the cavity to sustain oscillation. Using a smaller fraction of extracted power makes possible a larger power buildup. Since injection locking can be accomplished with a small fraction of the laser output power, large buildup factors can be obtained. By using a buildup cavity with an injection locked source, a fortunate combination of benefits becomes available: pump power enhancement in the OPO cavity, automatic frequency locking of the pump, noise reduction of all beams, and bandwidth reduction of all beams.

To optimize the strength of the injection locking, the injected light must be kept at the proper phase. This phase can be adjusted with a movable mirror in the path of the injected light beam. By actuating this mirror with a piezoelectric transducer (PZT), it is possible to maintain the optimum phase with a simple feedback loop. In the case of the semiconductor diode laser, the injection locked frequency varies with this phase, so a detector which monitors the centering of the pump frequency with respect to the center of the OPO resonator mode can be used to control the phase automatically. This can be done by monitoring the reflection of the beam incident on the OPO resonator. Superimposed on the reflected beam is a beam transmitted from the resonator whose phase depends on the relative frequency centering. This combined beam is sent through a quarter wave plate aligned to convert a linearly polarized beam into a circularly polarized beam. The transmitted beam is split into two orthogonal polarization components which are detected. The magnitude and sign of the frequency deviation is determined from the difference in the intensity in these two legs. If the pump illuminating the OPO resonator is frequency offset, the combined reflected/-transmitted beam will acquire some elliptical polarization. Ellipticity results in an unbalanced excitation of the two detectors, with the same sign as the ellipticity. By taking the difference between these signals, an error signal is derived which can be fed back to the PZT controlling the injection locking phase.

The resonant cavity is defined by low-loss complex-coated mirrors, at least one of which is transmissive of a fraction of the pump frequency for input and optical feedback. The output of the resonant cavity OPO is through a coated mirror which is of low loss at the pump frequency and one of the two OPO generated frequencies but which is transmissive of the second OPO generated frequency. To minimize absorption and scatter in the dielectric coated mirrors for the OPO cavity, the short wavelength coating is placed on top of the other coatings. The coating for the buildup cavity is the short wavelength stack in the simple OPO configuration. This coating may reflect only partially at the generated frequency, so a high reflecting stack at the second wavelength, the generated wave, lies beneath. This structure forms a reflector with a pair of reflecting frequencies at any desired location. The short wavelength stack has the highest net reflection because of the low absorption and scatter, while at the longer wavelengths the reflection coefficient is limited by the presence of absorption and scatter in the upper coating.

Threshold lowering obtained in accordance with the invention makes possible the use of the preferable SRO configuration, which allows continuous tuning, eliminating the mode jumps of the DRO. The threshold lowering also makes feasible the use of semiconductor diode lasers for driving OPOs. Although in principle the approach will work with any CW laser, it is advantageous to use the semiconductor diode laser because it is predisposed to injection locking. In addition, since diode lasers are inexpensive, reliable, small and efficient, such advantages extend to an OPO system which uses diode lasers for pumping.

The invention makes possible the generation of CW coherent beams in regions of the electromagnetic spectrum where no such source exists today. In other regions, it creates an alternative to lead-salt laser diodes, which require low-temperature cooling. Further, the configuration makes possible ultralong coherence length beams for use in interferometry and heterodyne spectroscopy across a broad wavelength region.

The invention will be better understood by reference to the following detailed description taken in conjunction with the accompanying drawings.

DESCRIPTION OF THE PREFERRED EMBODIMENTS

Figure 1:
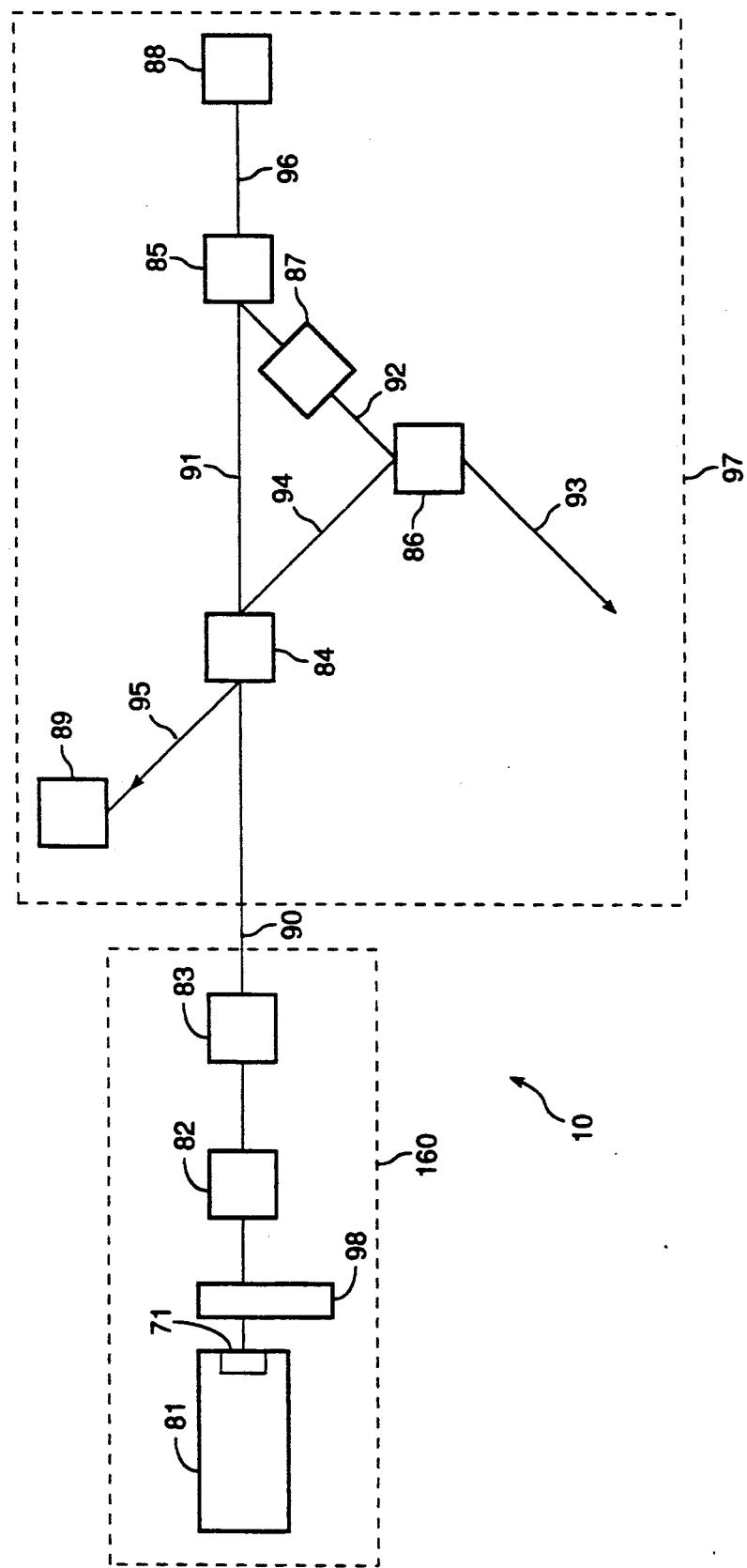
FIG. 1 is a schematic block diagram of a generalized embodiment of an optical parametric oscillator according to the invention.

Referring to FIG. 1, there is shown a schematic block diagram of a generalized embodiment of an optical parametric oscillator system 10 according to the invention comprising a laser source system 160 and an optical parametric oscillator (OPO) buildup cavity system 97. The laser source system 160 produces an output laser beam 90 which is sent into the OPO buildup cavity system 97.

The laser source system 160 comprises a laser 81 which produces an optical output which passes through a longitudinal mode selector 98, a mode matching system 82, and a phase adjuster 83. A portion of a beam in the buildup cavity 97 is coupled back into the source laser 81 to stabilize its output by injection locking, so that output laser beam 90 consists primarily of light at the pump frequency propagating to the into the buildup cavity system 97 with a small amount of light at the pump frequency propagating back into the source system 160.

Figure 2:
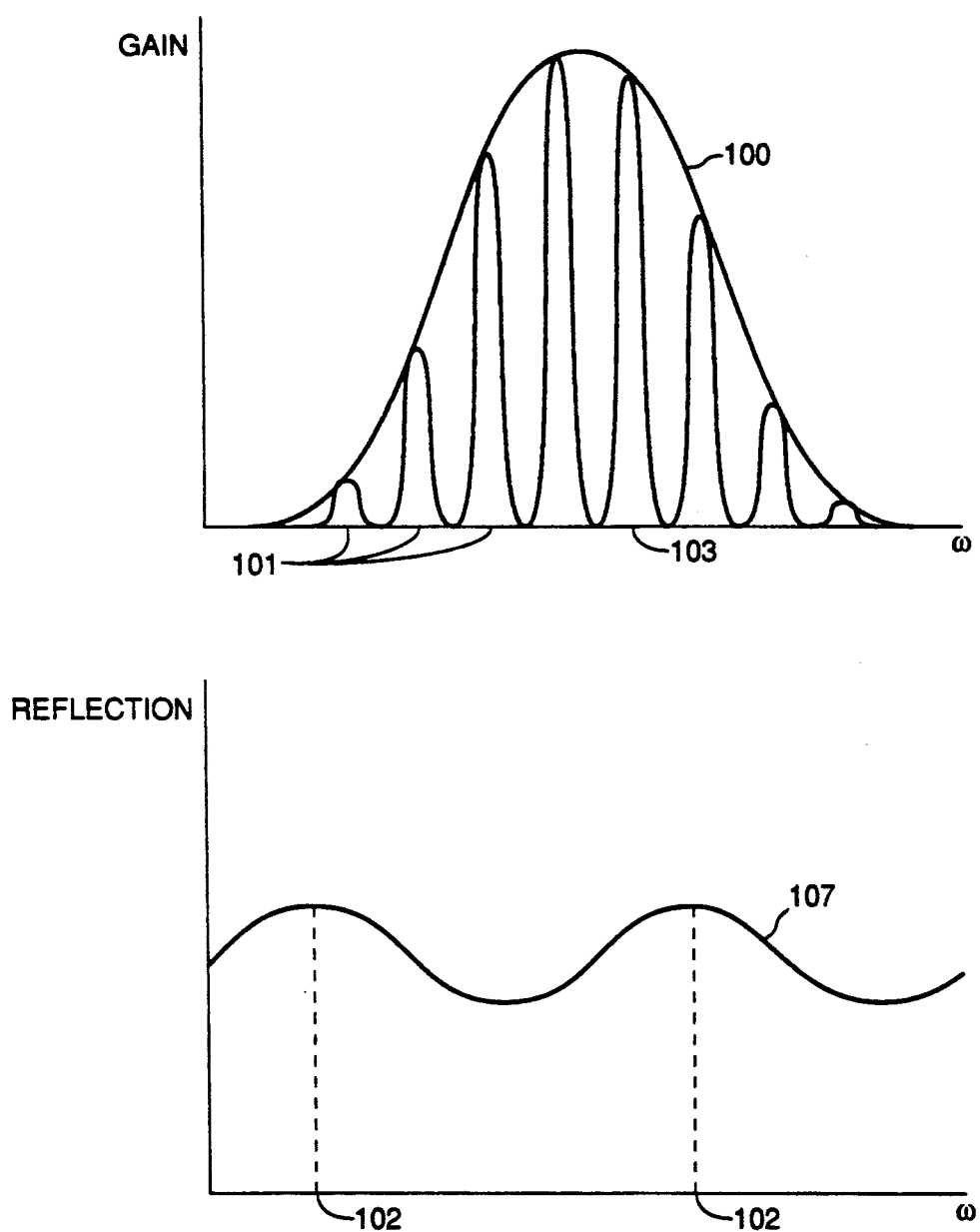
FIG. 2 is a spectral diagram which illustrates the frequency dependence of a semiconductor diode laser gain spectrum and the reflectivity of a longitudinal mode selector, and identifies the selected longitudinal mode.

FIG. 2 illustrates the action of the longitudinal mode filter 98 (FIG. 1) on the laser 81. Many longitudinal modes 101 appear within the laser gain curve 100, i.e., within the spectrum of the medium which can produce optical gain. In a free-running (unlocked) mode, several of these modes could be above threshold and oscillate simultaneously. One of these modes can be preferentially selected by a mode selector. The mode selector is defined by the face of the output reflector 71 (FIG. 4) and the opposing face of the longitudinal mode filter 98. Together they form a weak Fabry-Perot cavity. The reflection coefficient of this weak cavity is shown as curve 107 in FIG. 2. When the length of this cavity is set properly, one of the high reflection frequencies 102 of the mode selector overlaps with one of the many longitudinal modes 101 of the laser, reinforcing that particular mode 103 at the expense of all the other modes, and producing single mode laser operation. The short length of this Fabry-Perot produces a free spectral range which is larger than the gain bandwidth of the semiconductor laser, guaranteeing that only one longitudinal mode is favored. Provided that the favored mode has a higher net gain than the other modes, it will become the dominant mode. This mode can be selected by changing the separation between the mode selector and the laser output reflector.

An alternative configuration for the mode selector is to use one or more surfaces of any of the optical elements (such as the focussing lens or a beam expanding prism) to form Fabry-Perot cavities with the output facet of the laser. The mode selector can be outside the laser cavity as described above or inside the laser cavity as a Fabry-Perot etalon.

The mode matching system 82 refocuses the transverse mode of the source laser so that it closely matches the transverse mode of the buildup cavity formed by mirrors 84, 85 and 86. These mirrors are highly reflective of the pump frequency and at least one of the generated frequencies. The buildup cavities shown in FIGS. 4, 5, 6, and 7, could be used as an alternative. The pump beam is injected into the buildup cavity through the input mirror 84 which is somewhat transmissive at the pump frequency. Beam 91 is composed of the sum of the input wave and all of the partial waves at all frequencies which have made prior trips around the cavity. When the optical path length around the cavity is an integral number of wavelengths, these partial waves all add up in phase, producing an intensity which is proportional to the square of the number of partial waves. As a result of this phased sum, the power at the pump frequency in the beam 91 is many times larger than the power at the pump frequency in the beam 90. The buildup factor can be large if the finesse of the cavity is large and the cavity is pumped on one of its natural modes 105 shown in FIG. 3.

The optical beam is focussed inside the nonlinear OPO crystal 87, which is phase matched to produce resonant generation of two lower frequency optical beams. The techniques for phase matching are well known in the art, and are described, for example, in R. L. Byer, "Parametric Oscillators and Nonlinear Materials" in Nonlinear Optics, P. G. Harper et al., (eds.), Academic Press, 47–160 (1977), the subject matter of which is incorporated by reference. The beam 92, which emerges from the crystal, contains the output of the pump and the two generated frequencies, and it propagates to the output mirror 86 which is partially transmissive of at least a first generated beam, producing the reflected beam 94 and the output beam 93. The second generated beam will be built up at one of the longitudinal modes of the resonator in the same way as described for the pump.

Mirror 84 transmits a fraction of beam 94 which superposes with the reflected portion of the pump beam 90 and forms beam 95. Beam 95 enters the discrimination unit 89, which derives a feedback signal which in turn is used to control the phase shifter 83 and the frequency of the laser 81. The remainder of the beam 94 reflects from mirror 84, producing, in combination with the transmitted portion of the pump beam 90, the beam 91.

Mirror 85 is partially transmissive of the pump frequency, producing beam 96 which strikes the optical feedback element 88. If optical feedback is used, a portion of beam 96 is reflected back on itself so that a weak counter-propagating wave at the pump frequency is excited in the resonator. This beam is partially transmitted through mirror 84 into beam 90 and back into the pump laser source 81. This feedback power injection locks the source laser to one of the longitudinal modes of the resonator. The phase shifter 83 is useful to ensure that the injection locking is done at the optimum phase. The optical feedback element 88 can be a plane mirror if the beam 96 is collimated. Otherwise, it will also have focussing characteristics so that the reverse propagating beam has nearly the same beam diameter everywhere as the forward beam. The position of the optical feedback element 88 can also be used to adjust the phase of the feedback beam in place of the phase adjuster 83. Other locations for the optical feedback element 88 are also possible, some of which are shown in FIG. 4.

Figure 3:
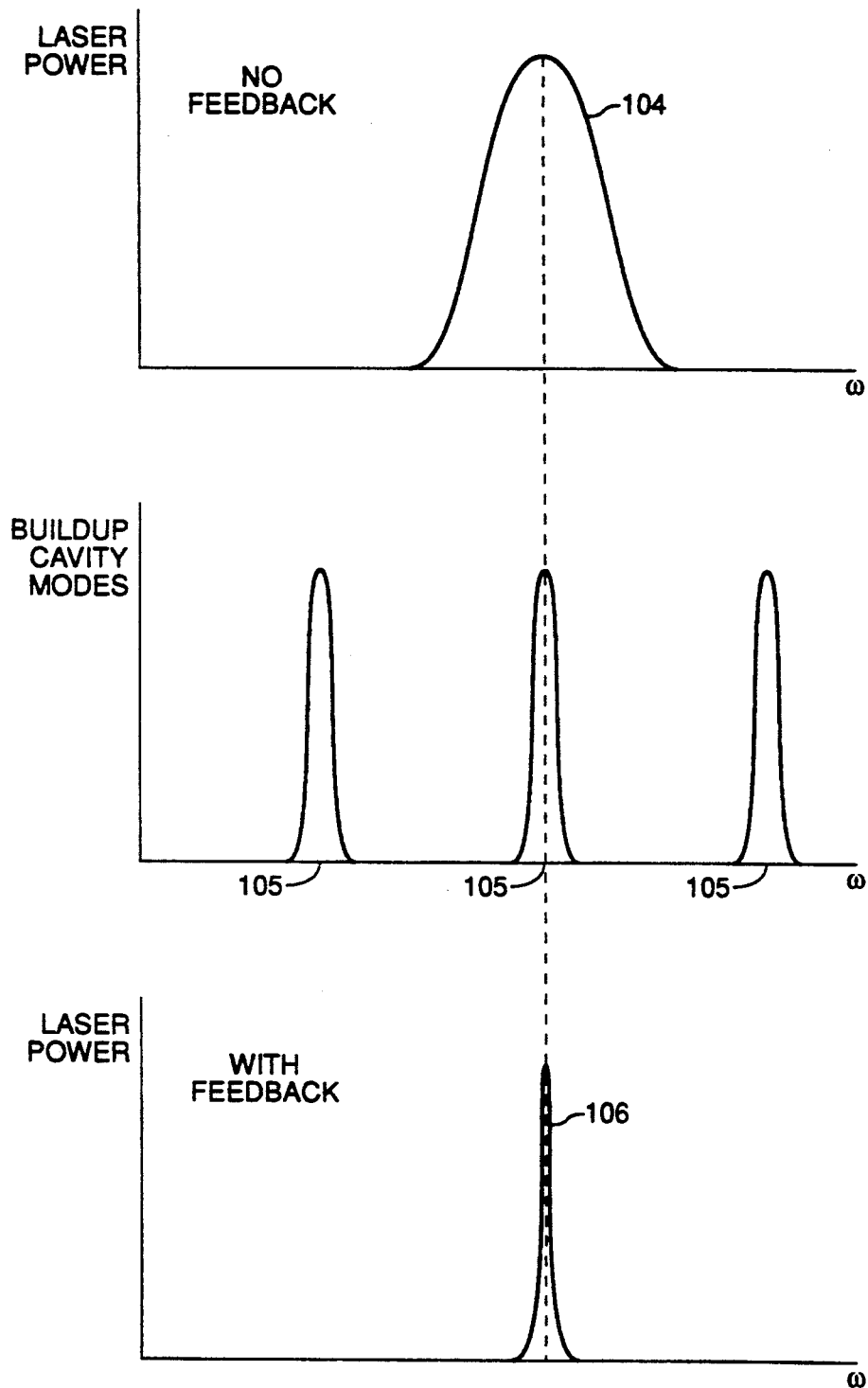
FIG. 3 is a spectral diagram which illustrates the emission spectrum of a single longitudinal mode diode laser operating without feedback, the frequency spectrum of the excitation of the buildup cavity longitudinal modes, and the emission spectrum of the single longitudinal mode diode laser operating with feedback.

FIG. 3 illustrates the optical locking process. The single longitudinal mode laser spectrum 104 without feedback is relatively broad and might fluctuate or drift in frequency as a function of time. This spectrum predominantly excites one of the longitudinal modes 105 of the buildup cavity. Frequency components emitted by the source laser which do not overlap with the buildup cavity mode are reflected from mirror 84 and do not enter the buildup cavity. A portion of the light which entered the buildup cavity is caused to re-enter the pump laser by the optical feedback element 88. This beam seeds the laser oscillation in the source laser, a process commonly called injection locking. The injection locked laser, being fed from the smoothed, filtered output of the buildup cavity, produces the narrowed spectrum 106 which lies within the cavity mode of the OPO cavity buildup system 97. If the phase of the injected beam is held stable, the injection locked laser and cavity buildup resonator can operate stably. Note that the optical feedback element 88 might cause the injection locking through other paths in addition to the reverse path outlined above.

Figure 4:
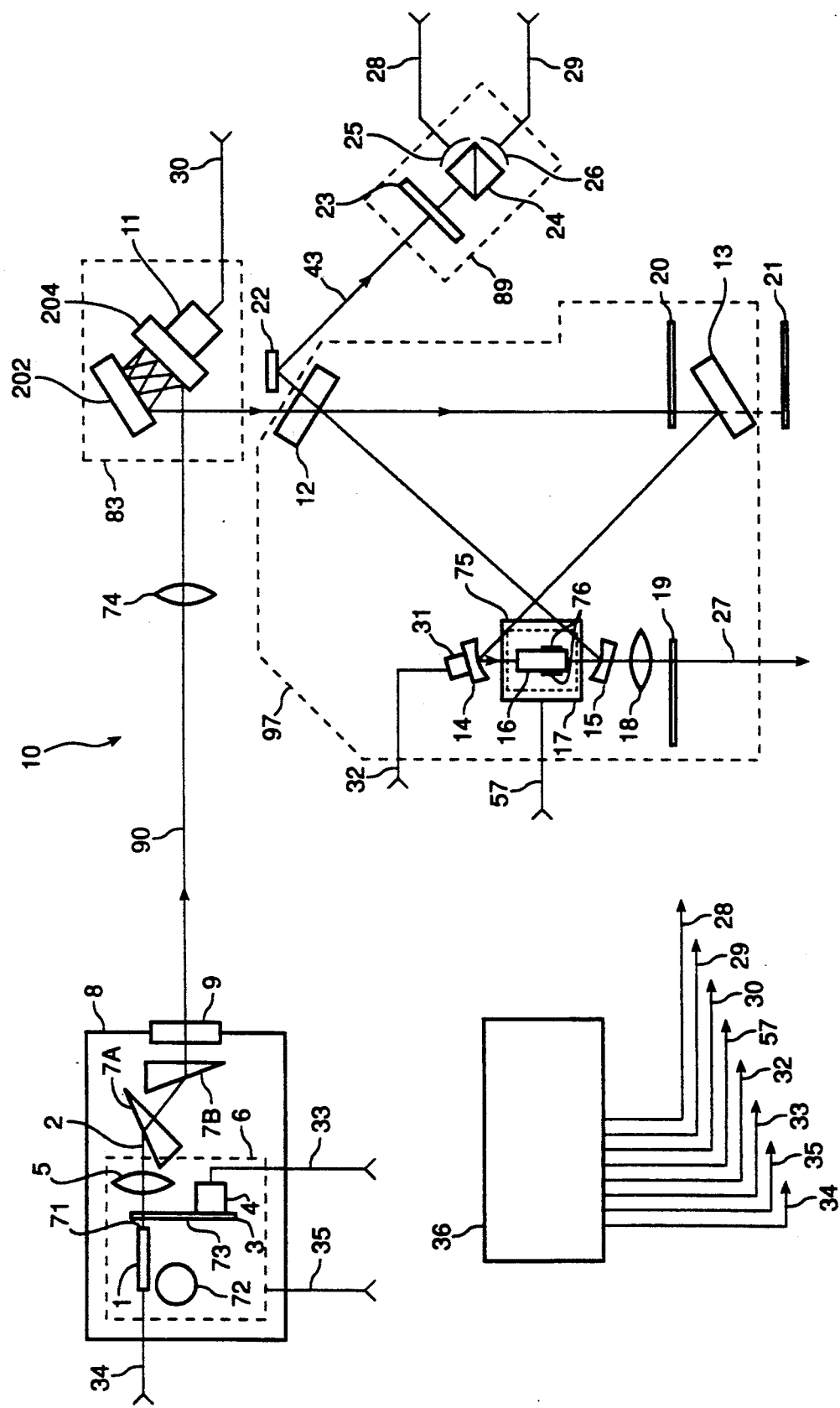
FIG. 4 is a schematic block diagram of a first embodiment of the invention including a ring resonator OPO configuration with adjustable optical feedback.

FIG. 4 illustrates a first specific embodiment of a diode pumped OPO 10 in accordance with the invention. A semiconductor diode laser 1, driven at a regulated constant current through cable 34, emits a laser beam 2. The longitudinal mode selector in this case is a thin glass plate 3 placed approximately 50 to 150 microns from the output facet 71 so that it reflects a portion of beam 90 back into the front facet 71 of laser 1. The front surface 73 of the glass plate and the facet 71 form a weak Fabry-Perot cavity which selects the longitudinal mode as described above with the aid of FIG. 2. The front and rear surfaces of the glass slide 3 also have an effect as an additional, fixed, weak etalon. A piezoelectric transducer 4 driven by a voltage arriving on cable 33, adjusts the separation of the plate 3 from the facet 71, allowing the selection of different longitudinal modes.

The strongly divergent beam emitted by the diode laser 1 (FIG. 4) is collimated by the lens 5, and made round by the two anamorphic prisms 7A and 7B. (Alternatively, a combination of spherical and cylindrical lenses could be used for this purpose.) The diode laser 1 is thermally connected to a thermoelectric cooler 6, which may employ a Peltier effect device having a heat sink to the atmosphere or to a water-cooled plenum. The diode laser 1 temperature can be set at the desired value by controlling the current flowing through cable 35 to the cooler 6. A thermal sensor 72 is mounted in close thermal contact to the diode laser 1. The output from this sensor 72 is compared with a desired value by electronic circuitry 36, and an output error signal drives the cooler 6 to produce the required temperature at the diode laser 1. By adjusting the polarity of the cooler 6, the diode laser 1 can be either cooled or heated.

Since cooled operation improves the performance of the diode laser 1, it is preferred over warmed operation. To maintain operation in the face of strong chilling, the diode laser 1 is encased in a sealed chamber 8 which can be evacuated to remove all condensable vapors from the atmosphere surrounding the diode laser 1. Water vapor would otherwise condense on the facets of the diode, interfering with its proper operation. The laser 1 can be operated either in a vacuum below about one Torr, which has the additional advantage of eliminating the thermal conduction to the walls through the air, or it can be backfilled with a dry gas such as Nitrogen to obtain a more reliable configuration. The diode optical output exits the chamber 8 through window 9. The entire apparatus 10 including the buildup cavity 97 could also be operated inside the sealed chamber, or any fraction of the apparatus which includes the diode laser 1.

The output beam 90 is passed through a mode matching lens 74 and a phase shifter comprised of mirrors 202, 204 and piezoelectric transducer 11, before injection into the buildup cavity 97. The mode matching lens focuses the transverse mode of the input beam 90 to approximately match the mode of the buildup cavity 97. As is well known in the art, this can be done with a single lens of the correct focal length placed at the correct spot, or it can be done with two or more adjustable lenses. The adjustable path length is provided by the pair of mirrors 202, 204 inclined to one another such that the laser beam 90 makes multiple bounces between them before emerging. One of these mirrors 204 is mounted on a piezoelectric actuator 11 driven by a high voltage source (not shown) through cable 30. The multiple bounces in this structure increase the total path length change produced by a given translation of the actuator 11. The purpose of this assembly is to adjust and stabilize the phase of the fraction of the laser radiation which is optically reinjected into the diode laser 1.

The incident beam which is partially transmitted through the mirror 12 enters the buildup cavity 97 formed by mirrors 12, 13, 14, and 15. The remainder of the input beam is reflected from mirror 12 and enters the discrimination unit 89. The transmitted beam circulates in the high finesse buildup cavity 97, repetitively passing through the nonlinear crystal 6 where it is tightly focussed. The nonlinear crystal 16 is phase matched so that the desired nonlinear optical generation takes place.

The crystal 16 is surrounded by a heater/cooler unit 17, which sets the temperature of the nonlinear crystal 16 to a desired value for optical generation in much the same way as for the laser diode 1, above. Temperature is controlled by electronics 36 through cable 37. A multiple translation-rotation stage 75 is provided for the crystal 16 to allow the phase matching angle to be adjusted for optimum conversion and coarse wavelength tuning. Electrodes 76 may be attached to the crystal 16 either transversely, as shown or longitudinally, to allow direct electronic tuning if desired. Mirror 15 is transparent either to idler radiation or to the signal radiation, which then exits the cavity 97 as the output beam 27, after being collimated by the lens system 18.

It is possible to build a dielectric mirror with high reflectivity at multiple frequencies by construction of multilayer dielectric stacks. There is no general solution. One case is where the two generated waves have nearly the same frequency. If the frequencies are separated by less than the bandwidth of a single mirror, a resonator with a single mirror type will provide resonance at both generated waves. A second conventional configuration is where one of the generated frequencies is three times the other generated frequency, the so-called 3:1 configuration. In this case, double resonance can also be obtained automatically, since a quarter-wave stack is also highly reflective of the third harmonic of the fundamental reflection frequency, with a correction due to the variation of the indices of the materials with wavelength. In the near infrared spectral region (near IR) and in the visible region, good optical materials are available which have a wide transmission range, so that a high total reflection can generally be obtained at the third harmonic provided that this frequency is not too far into the ultraviolet spectral region (UV).

A further problem exists where a tunable source is required. The two conventional configurations are unsatisfactory. A preferred solution to this problem is to use single wavelength dielectric stacks superimposed on each other on the surface of the mirror. This approach suffers from problems of optical absorption and scatter, and stress-induced delamination of the coatings, which limits the total number of layers in the multilayer dielectric stack.

The technique of superposing coatings works well for obtaining reflection at selected desired frequencies but is not generally suited for obtaining high transmission at desired additional frequencies. Because the net reflection is approximately the sum of the reflections of the different frequencies, the transmission tends to diminish at all frequencies. The transmission can only be optimized by adjusting the reflection spectra of the two coatings so that they each have optimal transmission at the desired frequency.

The four mirrors 12, 13, 14, and 15 form a high finesse Fabry-Perot cavity at both the pump wavelengths and at least one of the generated wavelengths. Provided that one of the longitudinal modes of this cavity matches what is produced by the laser source, an intense beam will build up in the resonator. For an ideal four mirror cavity with identical mirrors and no aberrations, the buildup factor B is given by:

$$B_o = T/(4(T+A)^2),$$

where T is the intensity transmission coefficient and A is the absorption coefficient of a mirror. If the absorption is negligible compared to the transmission, this becomes:

$$B_o = \tfrac{1}{4}T,$$

which can become very large. If the transmission is 250 parts per million, for example, a buildup factor of 1000 is obtained.

The buildup factor will be limited by 1) the aberrations in the cavity, which limit the finesse, 2) by the absorption in the nonlinear crystal 16, and 3) by the nature of the coatings on the cavity mirrors. The high reflective coatings for the cavity mirrors might be formed, for example, as two multilayer stacks laid down on top of each other. The thicker long wavelength stack, which would probably have more absorption, would be placed on the bottom for that reason. The coating which is reflective at the pump wavelength would in that case be placed on the top. In this situation, the losses at the pump wavelength would be comprised of the sum of the normal absorption and scattering losses in the reflective coatings, which are small, the losses in the nonlinear crystal, and the usual transmission losses. The losses at the second generated wavelength, however, would include all of the above losses with the addition of the losses incurred each time the beam penetrates the multilayer stacks provided to reflect the pump wavelength. Since the losses on transmission through a multilayer stack are much higher than the losses on reflection, this is an important technical factor in the optimization of such a device.

A large buildup is advantageous for reaching the OPO threshold, but it must be obtained stably. This can be done by injection locking the external laser 1 to a beam emerging from the buildup cavity system 97. Semiconductor lasers are particularly sensitive to such locking because of their small size and their large phase-amplitude coupling factor which enhances the locking. However, any laser can be locked to the cavity by this means.

Locking can be accomplished by extracting a fraction of the power which enters the Fabry-Perot cavity and injecting it back into the pump laser. Since the light in the Fabry-Perot cavity already satisfies the condition that it matches a longitudinal mode, this type of injection locking automatically locks the laser to a line of the cavity. Three alternative ways are shown in FIG. 4 whereby this optical feedback can be created for the ring cavity, and a larger variety can be used. A glass plate 19 can be placed in position at the beam 27 output so that the small fraction of the pump frequency beam which is likely to leak out of mirror 15 is coupled back into the ring in the reverse direction. This plate can be coated to adjust the coupling as desired.

The same function can also be performed with plates 20 and 21 in the system, within the cavity or disposed outside the cavity behind a partially-transmissive mirror 13. If the beam is collimated at these positions, simply reversing the beam direction maintains the modematching and results in efficient coupling of the reflected beam back into the source laser 1. Otherwise, the optical feedback elements must be properly focussing so that the reverse beam is mode matched to the pump laser. In the intracavity position of plate 20, the coupling factor must be quite small due to the coherent superposition of the partial waves. Plate 21 in the extracavity position may be optimal if enough intensity is available at its position because any pump beam output from this port is otherwise wasted. Some optical feedback may also be supplied as a result of the presence of scattering from the surfaces of the optical elements. If this is sufficient, additional elements may be dispensed with. The phase of the feedback optical beam is adjusted by the separation of the mirror pair 202, 204. For a stable fixed-wavelength system, the feedback phase can be kept constant. However, if frequency scanning is desired, and to eliminate the effects of fluctuations in the laser, active control of the feedback phase is desirable.

A discriminant can be obtained as explained by T. W. Hansch et al, "Laser frequency stabilization by polarization spectroscopy of a reflecting reference cavity", Opt. Commun. vol. 35, pp. 441-444 (1980), the subject matter of which is incorporated by reference. Referring to FIG. 4, the beam 43 reflected from mirror 22 is passed through a quarter-wave plate 23, which is adjusted so that the output is exactly circularly polarized when the cavity is illuminated on resonance. (The cavity is illuminated with a linear polarization which is slightly rotated from pure s-polarization.) The reflected beam 43 becomes elliptically polarized by an amount which depends on the frequency difference from the cavity longitudinal mode resonance frequency. The polarizing beamsplitter 24 produces unequal beams on the two detectors 25 and 26 whose difference depends on the elliptical polarization of beam 43, so by detecting the difference between the voltages on leads 28 and 29, one can determine whether the pump laser is off frequency, and in which direction, from the cavity mode center.

If an electrical feedback circuit is made to drive the transducer 11 proportional to the integral of this error signal, the diode laser can be forced to operate at the center frequency of the cavity resonance, even in the presence of pump laser fluctuations. Since the Fabry-Perot cavity is a passive device, it can be constructed with great stability so that it acts as an excellent frequency reference.

Various electronic feedback circuits which will perform this function have been built and published, so they need not be described in detail here. The voltage difference on lines 28 and 29 is the source signal which is offset and amplified by the feedback circuitry. An integrating feedback circuit is useful to establish the operating point in the presence of slow drifts, or user frequency adjustments. An additional AC coupled amplifier circuit can be used without integration to boost the response at the higher frequencies if desired. The combined output is further amplified, offset, filtered, and applied to drive an actuator in such a way that the system response to the actuator acts to reduce the voltage difference across lines 28 and 29.

The frequency of the pump laser can be scanned by adjusting the length of the Fabry-Perot cavity, for example, by adjusting the position of mirror 14 with the piezoelectric translator 31. If the phase transducer 11 is automatically controlled by the difference between the voltages on lines 28 and 29, the system can stably sweep through a certain frequency locking range by varying the voltage on control line 32. If in addition the center of the gain curve of the diode laser 1 is adjusted at the same rate as the Fabry-Perot mode, the frequency scanning range can be many locking ranges. It is limited only by the range of the phase adjuster 11. The diode free-running frequency is adjusted either by changing its drive current or its operating temperature. Other means of generating the discriminant are also available, such as by modulating the beam at a high frequency and detecting the ratio of the sidebands transmitted through the resonator. Other such techniques can be worked out. The Hansch technique has been described as a preferred embodiment because it involves no modulation, leaving a very quiet, narrow bandwidth beam, and because the error signal extends over the entire intermodal frequency range with relatively large amplitude. For some applications, these two advantages may not be important in which case one of the other approaches might be chosen.

Figure 5:
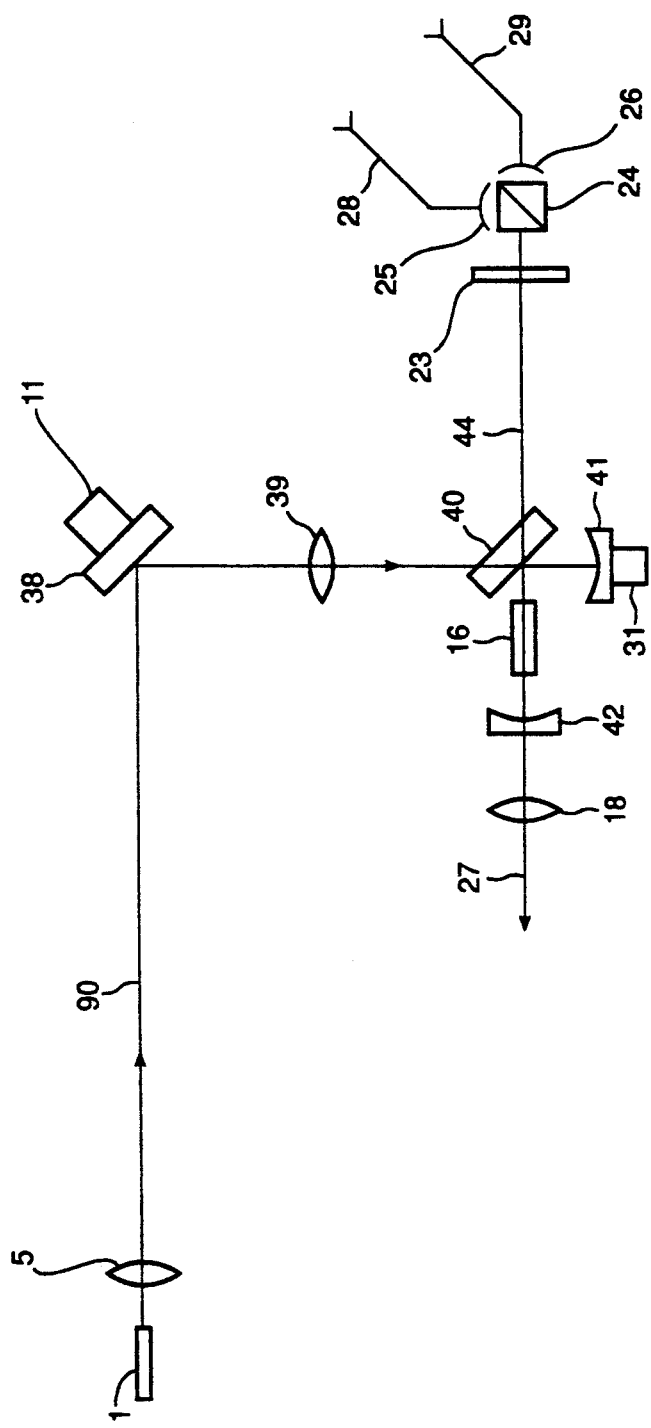
FIG. 5 is a schematic block diagram of a further embodiment of the invention including a folded resonator OPO configuration with fixed optical feedback.

Referring to FIG. 5, there is shown an alternative embodiment of the invention which uses a folded linear cavity. This embodiment has a fixed level of optical feedback into the diode laser which is determined principally by the ratio of the transmission of mirror 40 to the sum of the losses of the OPO resonator. As before, the laser 1 is focussed by lens 5 into beam 90. Many of the elements in this embodiment which have been described in connection with FIG. 4 above have been omitted for clarity. Beam 90 passes through the single-bounce phase shifter comprised of mirror 38 and PZT actuator 11, and it is injected into the OPO cavity through the mode matching lens 39. This cavity is composed of mirrors 40, 41, and 42, which are coated for high reflection at the pump frequency and at least one of the generated frequencies. These mirrors are configured to form a stable cavity with a beam waist inside nonlinear crystal 16. The desired fraction of the generated beam or beams is extracted through output mirror 42 and collimated by lens system 18 into output beam 27. The cavity length can be adjusted by translating mirror 41 with a PZT 31. As before, the discriminant can be obtained by passing beam 44 through the quarter-wave plate 23 and detecting the two orthogonally-polarized components of the beam.

This configuration has the advantage of zero astigmatism (which is not true of the ring configuration), which permits the highest possible buildup factor. However, it suffers from the fact that the crystal 16 is phase matched for conversion in both directions. If mirrors 40 and 41 are both coated for high reflection and mirror 42 is coated for low reflection at the output frequency, then all of the converted radiation can be collected into the output beam 27.

Figure 6:
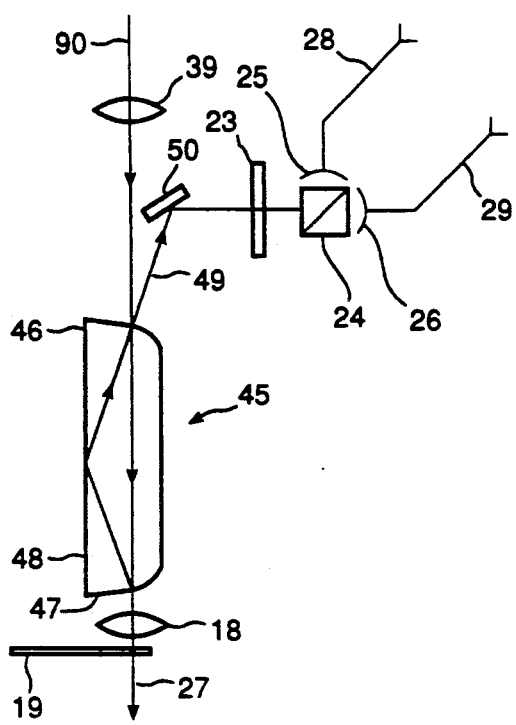
FIG. 6 is a schematic block diagram of an alternative buildup cavity with a monolithic ring resonator.

Referring to FIG. 6, there is shown an alternative embodiment of the invention which uses an OPO resonator based on a monolithic ring resonator. As above, some essential elements of this embodiment which have been described above in connection with other figures have been omitted for clarity. The input beam 90 is focussed as before through the lens 39 into the stable resonator formed by the faces of crystal 45, which has been oriented at an appropriate phase matching angle. Two focussing resonator reflection mirrors are provided by polishing and coating surfaces 46 and 47, while the polished surface 48 acts as a planar mirror at all frequencies due to total internal reflection. Mirrors 46 and 47 are highly reflecting at the pump frequency and at at least one of the generated frequencies. The output mirror 47 transmits the desired fraction of the output frequency, which is collimated by the lens system 18 into the output beam 27. Feedback for injection locking the pump laser (not shown) can be supplied by the plate 19 which can be coated for the desired reflection at the pump wavelength. As above, the beam 49 reflecting off the mirror 50 can be used to generate a discriminant to adjust the phase and free running frequency of the injection locking beam.

The advantage of this monolithic configuration is that a tremendous stability is obtainable. However, there is only one stable path inside the monolithic resonator. This configuration therefore does not lend itself to mechanical tuning. As a further variation on FIG. 6, one could replace one of the end mirrors 46 or 47 with a mirror coated onto a separate optical element. If this separate element is placed close to the monolithic element 45, most of the advantages of the monolithic approach are obtained while retaining the ability to re-align the device, for example, to compensate for a fabrication error or to adjust the phase matching angle by a small amount. Loss in stability might be compensated for by additional flexibility.

Figure 7:
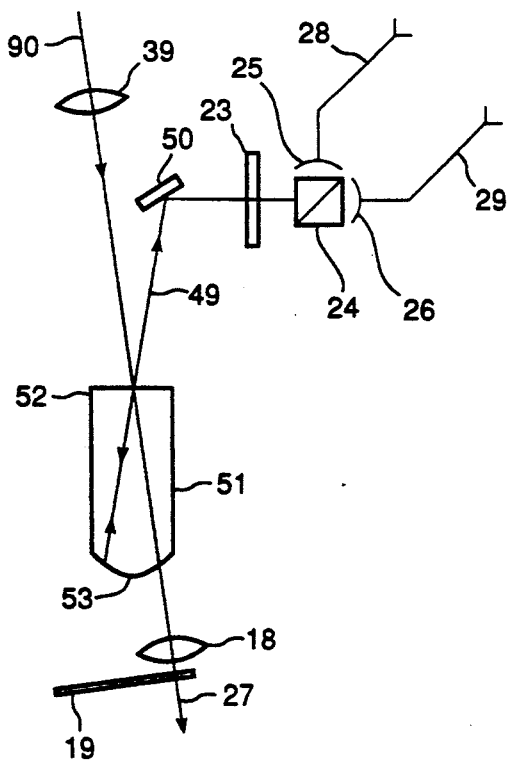
FIG. 7 is a schematic block diagram of an alternative buildup cavity geometry with a monolithic folded resonator.

Referring to FIG. 7, there is shown an alternative embodiment of the invention which uses an OPO resonator based on a monolithic folded linear resonator in a nonlinear crystal 51 supporting a V-shaped optical path. As before, many of the required elements in this figure which have been described above have been omitted for clarity. This system is a hybrid of the folded linear resonator of FIG. 5 and the monolithic approach of FIG. 6, and it combines the advantages of both. The astigmatism is zero and the stability of the monolithic cavity is obtained. The crystal 51 is also cheaper to fabricate than the crystal 45 (FIG. 6). As above, there are mirrors 52 and 53 which are surfaces of the crystal 51 coated for high reflection at the pump frequency and at at least one of the generated frequencies. Output mirror 53 is coated for the desired transmission of the output frequency, which is generated in both directions, although in only one of the legs of the V-shaped optical path.

Figure 8:
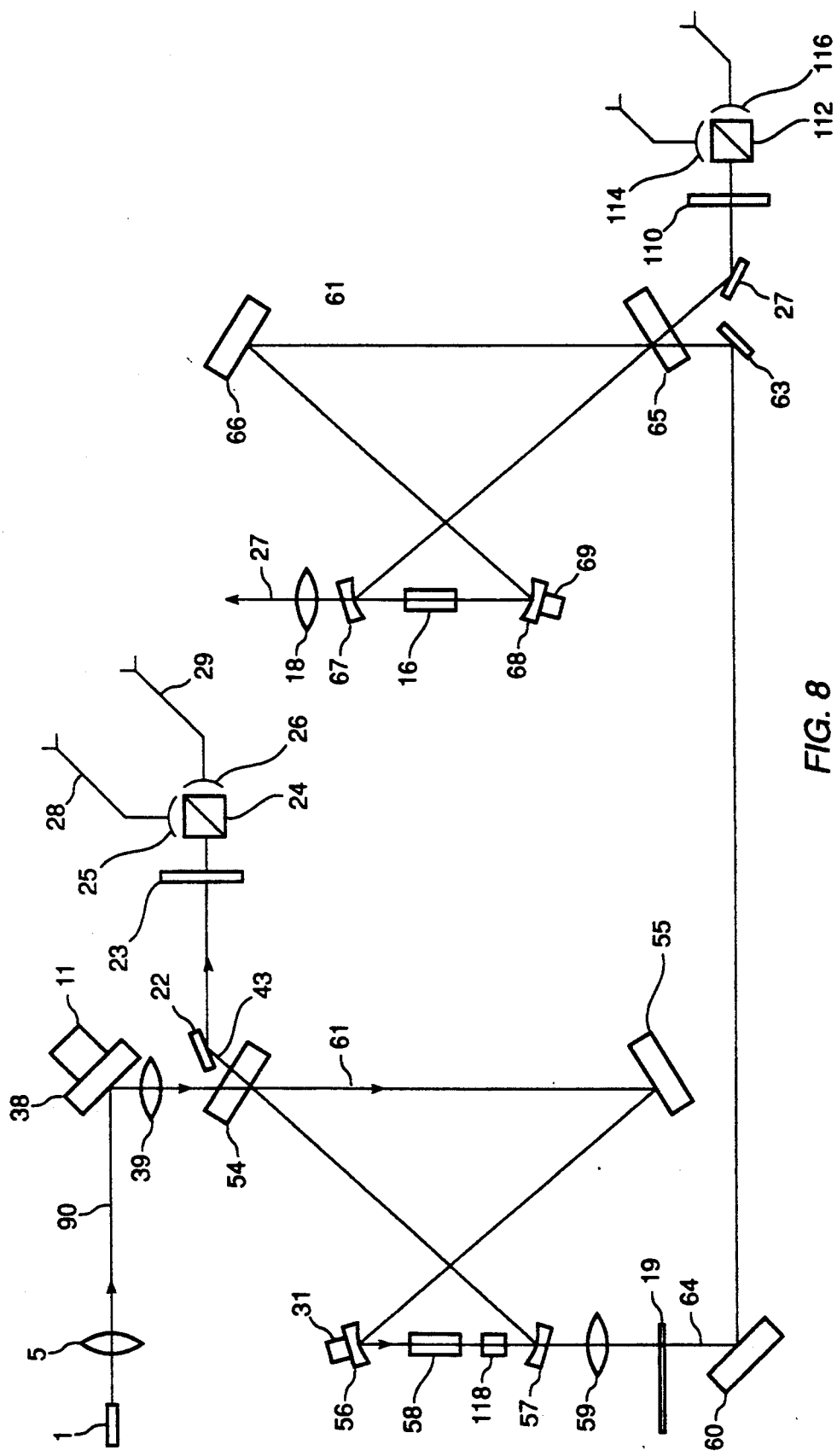
FIG. 8 is a schematic block diagram of a further embodiment of the invention wherein the pump source for the OPO resonator is a doubling or tripling cavity.

Referring to FIG. 8, there is shown an alternative embodiment of the invention wherein the pump for the OPO is a doubled, tripled, or other harmonically converted laser. The advantage of this configuration is that the wavelength range obtained by the diode pumped OPO is extended to shorter wavelengths. As above, some elements in this figure which have been described above have been omitted for clarity. The laser 1 emits beam 90 which is collimated by the lens 5, reflects from the phase shifting mirror 38, and is mode-matched by lens 39 into the ring resonator formed by mirrors 54, 55, 56, and 57. Mirrors 54, 55, 56 and 57 are highly reflective at the frequency of laser diode 1, which builds up to a high value in the resonator. The beam 61 is focussed into the nonlinear crystal 58 which is phase matched for generating a harmonic multiple of the laser light. The resonator mirrors may also be highly reflective at the harmonic multiple frequency, in which case the crystal 58 will have to be operated as near as possible to phase matching while still allowing the harmonic light to propagate on one of the longitudinal modes of the system. The output mirror 57 has the desired transmission for the doubled beam which forms the beam 64 after being collimated by the lens system 59. Optical feedback of the desired magnitude is obtained from plate 19 or at other locations which may be convenient. The discriminant is obtained from the beam 43 with the same apparatus as before, optical injection locking of the source laser 1 is obtained by controlling the phase of the feedback beam with the phase adjuster mirror 38, and the optimal pump frequency is obtained by adjusting the center frequency of the gain curve of the pump laser 1 and by adjusting the cavity length with PZT 31.

The output 64 of the harmonic converter cavity is directed into the OPO cavity with mirrors 60 and 63. The OPO cavity is formed from mirrors 65, 66, 67, and 68, which are highly reflective at the frequency of the harmonic multiple output and at at least one of the OPO generated frequencies. The OPO crystal 16 is phase matched for the generation of a pair of frequencies whose sum is equal to twice the laser frequency. The discriminant is generated by the second apparatus formed by the quarter wave plate 110, the polarizing beam splitter 112, and the two detectors 114 and 116. This discriminant permits the adjustment of the length of the OPO cavity with, for example, the piezoelectric transducer 69, so that harmonically multiplied beam from the pump laser excites it on one of its longitudinal modes. The output mirror 67 transmits the desired fraction of the chosen generated frequency, which is collimated by the lens system 18 to form the output beam 27.

A second crystal 118 might be placed into the first resonator to permit mixing of the laser fundamental frequency with the harmonic generated in crystal 58, to produce a higher harmonic output. This is advantageous because of the high intensity of fundamental radiation which has already been produced intracavity to enhance the harmonic conversion efficiency. The crystal 118 is phase matched for mixing the fundamental with the harmonic, and mirror 57 is transmissive at the higher harmonic. This higher harmonic output might be useful for itself in some application, or it might form the input for the OPO resonator. In the latter case, the resonator mirrors 65, 66, 67 and 68 are configured with coatings highly reflective at the higher harmonic, and the mode matched crystal 16 generates two waves, the sum of whose frequencies equals the higher harmonic frequency.

If desired, additional resonant cavities can be interposed between mirrors 60 and 63, producing additional harmonic conversion, mixing, or OPO steps to further broaden the frequency range which can be obtained using this approach. Since the waves generated in this chain are all coherent with each other, they can all be resonated if it is desired to reduce the nonlinear threshold at a given stage.

Figure 9:
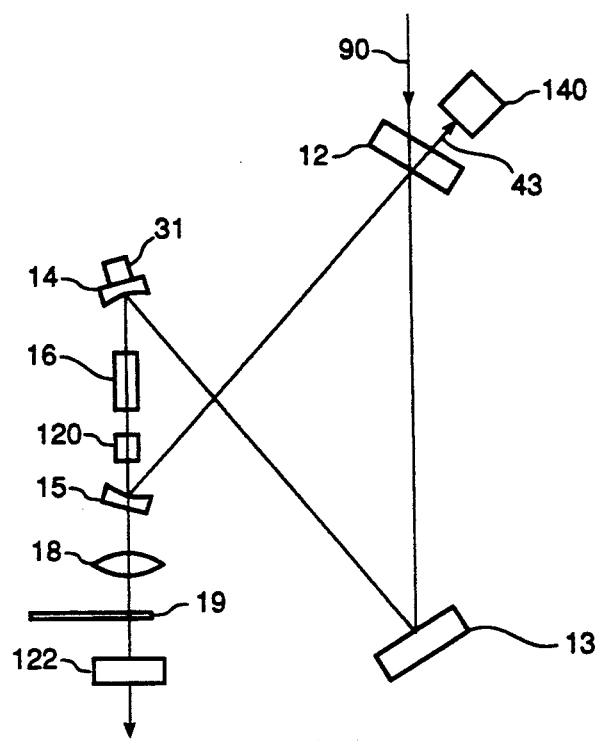
FIG. 9 is a schematic block diagram of a modified buildup cavity geometry which contains a second nonlinear crystal.

Referring to FIG. 9, there is shown an alternative embodiment of the invention wherein a second nonlinear crystal 120 is placed within the tightly focussed region in the cavity collinear with the first nonlinear OPO crystal 16. Elements in this figure which have been described previously have been omitted for clarity. The first crystal 16 generates two beams at longer wavelengths than the input beam 90. The resonator is highly reflective for both the input radiation and at least one of the generated beams. As above, a discriminant is generated by analyzing the beam 43 with the discriminator 140, and the error signal is applied to correct the phase of the feedback radiation in the case that beam 90 is directly provided by the injection locked laser. In the case that beam 90 is provided by an earlier resonator in the chain, the error signal is applied to the length of the cavity by actuating the PZT 31.

The second crystal 120 is temperature and angle controlled in the same way as is crystal 16, in order to obtain phase matching for summing the input laser frequency with the chosen generated beam. The phase matching condition is identical to that of an OPO which is pumped at the sum frequency and generates both the laser fundamental frequency and the chosen generated beam. An output mirror such as mirror 15 transmits the sum frequency, and if desired, a wavelength separation device may be provided as an additional element 122 to separate this frequency from any other frequency which emerges from the resonator. Element 122 can be one of many types of well known devices such as a Pellin-Broca prism or a multilayer coating. The advantage of this approach is that an additional frequency is generated which is at a shorter wavelength than the frequency of the input laser beam 90, and which is continuously tunable.

Figure 10:
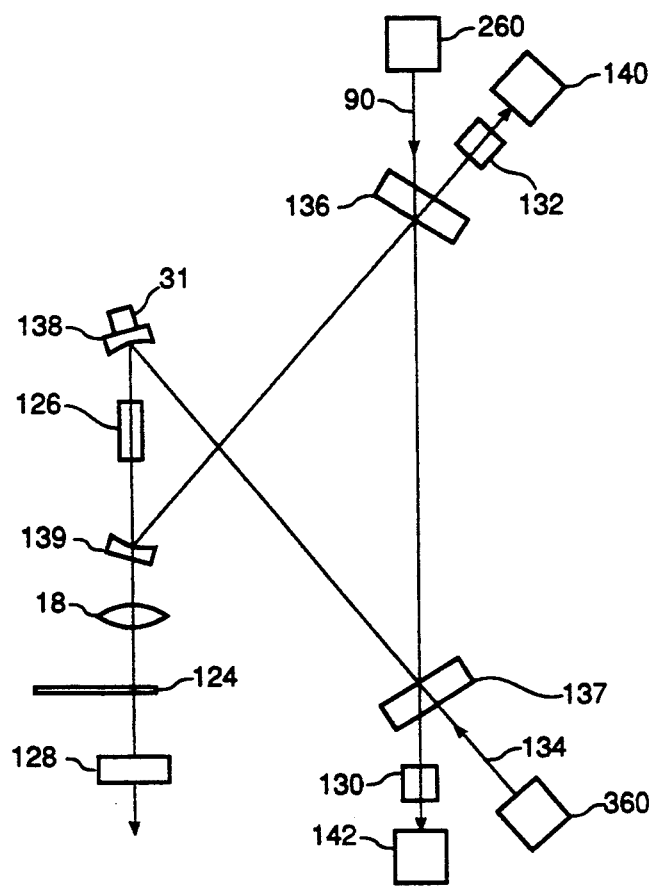
FIG. 10 is a schematic block diagram of an alternative buildup cavity geometry which allows mixing of two different frequency lasers.

In FIG. 10, there is shown an alternative embodiment of the invention in which a single resonator is ex cited on different longitudinal modes by two external lasers 260 and 360 through beams 90 and 134. As above, some elements in this embodiment which have been described above have been omitted for clarity. This configuration is useful for mixing the outputs of two lasers. The output beam 90 from a first source laser 260 is mode-matched into the resonator formed by the mirrors 136, 137, 138 and 139, which are highly reflective at the frequency of the first source laser beam 90 and at the frequency of the second source laser beam 134. As above, this first laser beam 90 is built up in the resonator by feeding back a portion of the optical energy from the resonator and injection locking the first laser 260. A feedback element 124 is frequency-selectively coated to reflect the desired amount of light at the frequencies of both the first and second lasers 260 and 360. As above, a discriminant is generated by means of a discrimination unit 140, and the phase and free running frequency of the first injection locked beam 90 is optimized prior to input into the resonator cavity through a feedback loop and a phase adjuster in the laser 260 (not shown, but similar to laser 160 of FIG. 1) in the path of the first laser beam 90. Element 132 is a frequency selective element as discussed above which is set to transmit the frequency emitted by the first laser, but to reflect the frequency emitted by the second laser.

In addition, the second laser beam 134 is independently built up in the resonator by feeding back a portion of the optical energy from the resonator and injecting it into the second laser 360. A discriminant is generated with a second discrimination unit 142 which is composed of the identical components as the first discrimination unit 140, and the phase of the second injection locked beam 134 is optimized upstream of its input into the resonator through a feedback loop and a phase adjuster (not shown in laser 360 but similar to laser 160 of FIG. 1) in the path of the second laser beam 134. Element 130 is a frequency-selective element similar to element 132 as discussed above which is set to transmit the frequency emitted by the second laser, but to reflect the frequency emitted by the first laser.

The nonlinear crystal 126 is phase matched to mix the frequencies of the first and the second laser beams 90, 134, producing either the sum or the difference frequency. Output mirror 139 transmits this generated frequency, which is focussed by the lens system 18 and filtered by the frequency selective element 128. Tuning is accomplished by adjusting the position of resonator mirror 138 with the PZT 31. The drive electronics (not shown) of both lasers is set up as described above to automatically track the laser frequency to that of the resonator, so that a total tuning range equal to many locking ranges is obtained. This configuration may be useful, for example, to sum the output frequencies of two lasers for injection into the OPO cavity discussed above. This approach would allow, for example, the combination of a high-powered fixed wavelength laser with a lower-powered tunable laser to obtain a moderate-powered tunable pump beam to drive an OPO.

Figure 11:
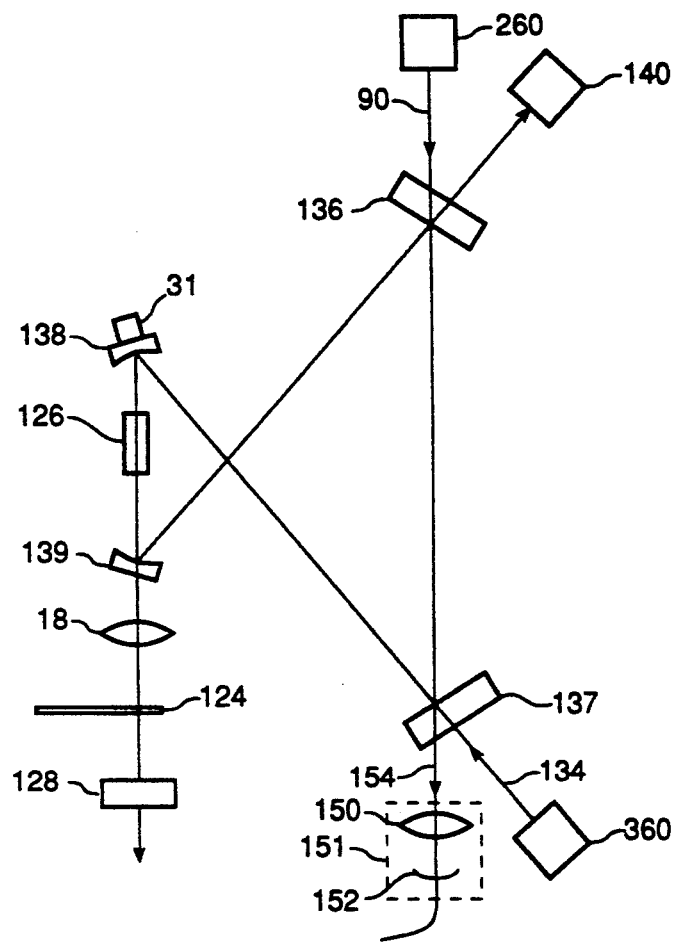
FIG. 11 is a schematic block diagram of an alternative buildup cavity geometry which allows the phase and frequency synchronization of two distinct lasers and the combination of their outputs in a resonator for applications.

Referring to FIG. 11, there is shown an alternative embodiment of the invention for combining laser beams in which a single resonator is excited by two external lasers 260 and 360 on the same longitudinal mode and therefore at the same frequency. As above, many of the required elements in this figure which have been described previously have been omitted for clarity. In this case, only one discrimination unit 140 is required, for the first laser beam 90. The second laser beam 134 is then injection locked by the same frequency which injection locks the first laser 260. However, the phase of the second laser 360 may slip relative to that of the first, so a phase detector 151 is provided. The phase detector 151 can be made up of a focussing lens 150 and a photodetector 152. The incident beam 134 from the second laser 360 is partially reflected by mirror 137. This reflection, combined with the partial transmission of the mode in the resonator, form the beam 154 which impinges on the phase detector 151. The two components, which are at essentially the same frequency, interfere, producing an output current at the photodetector 152 proportional to the sine of the optical phase between the two beams. Where the stable operating point of the system is maintained off the peak of the curve of power vs. phase extracted from the phase detector 151, an error signal is derived which is amplified and fed back to control the phase of a phase adjuster (not shown but similar to element 83 of FIG. 1) in the input path of the beam 134. The phase measured on detector 152 therefore remains constant except for fluctuations caused by noise and the like. By this means, the two lasers 260 and 360 have been frequency locked to the same longitudinal mode of the resonator, where their output powers are summed. Multiple lasers can be locked to the resonator with the same technique.

The output of two independent lasers 260 and 360 are combined for a range of different applications, including, for instance, particle measuring systems, which need a high power low noise beam as a probe. In this case, element 126 is a utilization means such as a flow cell containing particles to be measured. In a frequency doubler system, element 126 is a nonlinear crystal which is phase matched for generation of twice the input laser frequency. The addition of the output of two equal lasers quadruples the efficiency of the conversion. To generate a lower frequency tunable beam, element 126 may be an OPO crystal which is phase matched for generation of a pair of waves whose frequencies sum to the laser frequency. In this case, mirrors 136, 137, 138, and 139 are also highly reflecting for at least one of the generated waves, and the output mirror 139 is partially transmissive at the frequency of the chosen generated wave.

All of the above configurations can be modified to accept an amplifier to boost the output power of the source laser. In FIG. 4, for example, the amplifier might be placed between the window 9 and the focussing lens 74. Additional focussing and steering optics might be required to make optimal use of the amplifier. Use of an amplifier would increase the laser power entering the OPO resonator, thereby raising the output of the OPO. In addition, an amplifier reduces the fraction of the power which needs to be coupled out of the OPO resonator in order to injection lock the source laser. If the amplifier is in the optical path of the feedback beam as suggested for the case of FIG. 4, it will also amplify the feedback beam before it is injected into the laser. In the case where such amplification of the feedback beam is not desirable (for example due to an instability in the source laser), it might be necessary to modify the feedback path. Instead of sending the feedback beam back on the original beam path, a new beam path is used for the feedback beam which bypasses the amplifier. The feedback is injected into the laser through another oscillator mirror or by using a beamsplitter, for example. The amplifier could also be a phase locked array instead of a single unit, provided that means are provided for producing an output beam which is near enough to diffraction limited so that it can be focussed effectively into the OPO resonator.

Various embodiments of a CW laser pumped OPO and methods for increasing the laser power in the OPO and stabilizing the output power of the OPO have been shown and explained in accordance with the invention. Variations in approach including linear or ring cavities, and monolithic or discrete element cavities, chained resonant feedback stabilized frequency converter cavities, dual crystal resonators and resonant diode power combiners have also been described. Such a laser configuration is useful whenever a tunable laser source is required, or when a compact, room-temperature, solid state light source is required in a wavelength region where none presently exists. This may occur when there is a need for a specific wavelength to identify or excite a species in scientific or industrial applications such as lidar (light detection and ranging) and absorption spectroscopy. Such a laser configuration is also useful whenever a long coherence length is required such as in distance or velocity measurement.

While the invention has been shown and described with reference to specific embodiments, it is understood by those skilled in the art that changes in the form and details may be made without departing from the spirit or scope of the invention.

What is claimed is:

1. An optical parametric oscillator apparatus for generating an optical output beam at a wavelength longer than an optical pump beam, the apparatus comprising:
    an optical pump means including an optical cavity for producing a first optical beam of a first wavelength with a first free running bandwidth;
    a resonator cavity means for supporting buildup of selected optical power at least said first wavelength within said resonator cavity means, said resonator cavity means being disposed in a position relative to said optical pump means to have an axis coincident with said first optical beam;
    an optical parametric oscillator crystal means disposed within said resonator cavity means for generating a second optical beam at a second wavelength and a third optical beam at a third wavelength upon excitation of said crystal means by said first optical beam at a power level per unit area above a predetermined threshold level, said second wavelength and said third wavelength being longer than said first wavelength;
    mirror means for admitting said first beam at said first wavelength into said resonator cavity means and for extracting a first portion of at least said third beam at said third wavelength from said resonator cavity means; and
    optical feedback means for controlling said optical pump means to optimize power at said first wavelength propagating within said resonator cavity means and for injection locking said optical beam to said resonator cavity means.

2. An optical parametric oscillator apparatus for generating an optical output beam at a wavelength longer than an optical pump beam, the apparatus comprising:
    an optical pump means including an optical cavity for producing a first optical beam of a first wavelength with a first free running bandwidth;
    a resonator cavity means for supporting buildup of selected optical power at least said first wavelength within said resonator cavity means, said resonator cavity means being disposed in a position relative to said optical pump means to have an axis coincident with said first optical beam;
    an optical parametric oscillator crystal means disposed within said resonator cavity means for generating a second optical beam at a second wavelength and a third optical beam at a third wavelength upon excitation of said crystal means by said first optical beam at a power level per unit area above a predetermined threshold level, said second wavelength and said third wavelength being longer than said first wavelength;
    mirror means for admitting said first beam at said first wavelength into said resonator cavity means and for extracting a first portion of at least said third beam at said third wavelength from said resonator cavity means; and
    optical feedback means for controlling said optical pump means to optimize power at said first wavelength propagating within said resonator cavity means and for injection locking said optical beam to said resonator cavity means;
    wherein said feedback means comprises means for extracting a second portion of said first optical beam at said first wavelength within a second bandwidth at a mode which has been selected by said resonator cavity means and for injecting said second portion into said optical pump means for optically frequency locking and stabilizing said first optical beam of said optical pump means.

3. The apparatus according to claim 1, wherein said feedback means includes means for adjusting phase of said first optical beam.

4. The apparatus according to claim 1, wherein said feedback means includes means for adjusting center frequency of the gain curve of said optical pump means for expanding tuning range of said first optical beam.

5. The apparatus according to claim 3, wherein said feedback means further includes means for sensing centering of said first wavelength with respect to center of a dominant longitudinal mode of said resonator cavity means and for providing a control signal for adjusting wavelength of said optical pump means in response to said sensing of said centering.

6. The apparatus according to claim 5, wherein said feedback means further includes means for adjusting wavelength of said first optical beam.

7. The apparatus according to claim 1, wherein said mirror means comprises:
an input mirror for admitting said first optical beam into said resonator cavity means; and
an output mirror for extracting said first portion of at least said third optical beam from said resonator cavity means.

8. The apparatus according to claim 7 wherein said input mirror has a high reflectivity coating at said first wavelength and at said second wavelength while being partially transmissive at said first wavelength.

9. The apparatus according to claim 7 wherein said output mirror has a high reflectivity coating at said first wavelength and at said second wavelength while being partially transmissive at said third wavelength.

10. The apparatus according to claim 7 wherein said input mirror has a high reflectivity coating at said first wavelength, at said second wavelength at said third wavelength while being partially transmissive at said first wavelength and wherein said output mirror has a high reflectivity coating at said first wavelength and at said second wavelength while being partially transmissive at said third wavelength.

11. An optical parametric oscillator apparatus for generating an optical output beam at a wavelength longer than an optical pump beam, the apparatus comprising:
an optical pump means including an optical cavity for producing a first optical beam of a first wavelength with a first free running bandwidth;
a resonator cavity means for supporting buildup of selected optical power at least said first wavelength within said resonator cavity means, said resonator cavity means being disposed in a position relative to said optical pump means to have an axis coincident with said first optical beam;
an optical parametric oscillator crystal means disposed within said resonator cavity means for generating a second optical beam at a second wavelength and a third optical beam at a third wavelength upon excitation of said crystal means by said first optical beam at a power level per unit area above a predetermined threshold level, said second wavelength and said third wavelength being longer than said first wavelength;
mirror means for admitting said first beam at said first wavelength into said resonator cavity means and for extracting a first portion of at least said third beam at said third wavelength from said resonator cavity means; and
feedback means for controlling said optical pump means to optimize power at said first wavelength propagating within said resonator cavity means, wherein said optical pump means is a diode laser.

12. An optical parametric oscillator apparatus for generating an optical output beam at a wavelength longer than an optical pump beam, the apparatus comprising:
an optical pump means including an optical cavity for producing a first optical beam of a first wavelength;
a resonator cavity means for supporting buildup of selected optical power at at least said first wavelength within said resonator cavity means, said resonator cavity means being disposed in a position relative to said optical pump means to have an axis coincident with said first optical beam;
an optical parametric oscillator crystal means disposed within said resonator cavity means for generating a second optical beam at a second wavelength and a third optical beam at a third wavelength upon excitation of said crystal means by said first optical beam at a power level per unit area above a predetermined threshold level, said second wavelength and said third wavelength being longer than said first wavelength;
mirror means for admitting said first beam at said first wavelength into said resonator cavity means and for extracting a first portion of at least said third beam at said third wavelength from said resonator cavity means; and
feedback means for controlling said optical pump means to optimize power at said first wavelength propagating within said resonator cavity means, wherein said resonator cavity means is a ring cavity.

13. An optical parametric oscillator apparatus for generating an optical output beam at a wavelength longer than an optical pump beam, the apparatus comprising:
an optical pump means including an optical cavity for producing a first optical beam of a first wavelength with a first free running bandwidth;
a resonator cavity means for supporting buildup of selected optical power at least said first wavelength within said resonator cavity means, said resonator cavity means being disposed in a position relative to said optical pump means to have an axis coincident with said first optical beam;
an optical parametric oscillator crystal means disposed within said resonator cavity means for generating a second optical beam at a second wavelength and a third optical beam at a third wavelength upon excitation of said crystal means by said first optical beam at a power level per unit area above a predetermined threshold level, said second wavelength and said third wavelength being longer than said first wavelength;
mirror means for admitting said first beam at said first wavelength into said resonator cavity means and for extracting a first portion of at least said third beam at said third wavelength from said resonator cavity means; and
feedback means for controlling said optical pump means to optimize power at said first wavelength propagating within said resonator cavity means, wherein the optical power propagates in both directions in said resonator cavity means.

14. An optical parametric oscillator apparatus for generating an optical output beam at a wavelength longer than an optical pump beam, the apparatus comprising:

an optical pump means including an optical cavity for producing a first optical beam of a first wavelength with a first free running bandwidth;

a resonator cavity means for supporting buildup of selected optical power at least said first wavelength within said resonator cavity means, said resonator cavity means being disposed in a position relative to said optical pump means to have an axis coincident with said first optical beam;

an optical parametric oscillator crystal means disposed within said resonator cavity means for generating a second optical beam at a second wavelength and a third optical beam at a third wavelength upon excitation of said crystal means by said first optical beam at a power level per unit area above a predetermined threshold level, said second wavelength and said third wavelength being longer than said first wavelength;

mirror means for admitting said first beam at said first wavelength into said resonator cavity means and for extracting a first portion of at least said third beam at said third wavelength from said resonator cavity means; and feedback means for controlling said optical pump means to optimize power at said first wavelength propagating within said resonator cavity means, wherein said resonator cavity means is formed of a monolithic structure.

15. An optical parametric oscillator apparatus for generating an optical output beam, the apparatus comprising:

an optical pump means having an optical cavity for producing a first optical beam of a first wavelength;

a first resonator cavity means for supporting buildup of selected optical power at at least said first wavelength within said first resonator cavity means, said first resonator cavity means being disposed in a position relative to said optical pump means to have an axis coincident with said first optical beam;

a first nonlinear crystal means in said first resonator cavity means which is phase matched for generating a second optical beam at a second wavelength which is a harmonic multiple frequency of said first wavelength;

first mirror means for admitting said first beam at said first wavelength into said first resonator cavity means and for extracting a portion of said second beam at said second wavelength from said first resonator cavity means;

first feedback means for controlling said optical pump means to optimize power at said first wavelength propagating within said first resonator cavity means;

a second resonator cavity means for supporting buildup of selected optical power at at least said second wavelength within said second resonator cavity means, said second resonator cavity means being disposed in a position relative to said first resonator cavity means to have an axis coincident with said second optical beam;

an optical parametric oscillator crystal means disposed within said second resonator cavity means for generating a third optical beam at a third wavelength and a fourth optical beam at a fourth wavelength upon excitation by said second optical beam at a power level per unit area above a threshold level, said third wavelength and said fourth wavelength being longer than said second wavelength;

second mirror means for admitting a portion of said second beam at said second wavelength into said second resonator cavity means and for extracting a portion of at least said fourth beam at said fourth wavelength from said second resonator cavity means; and second feedback means for controlling length of said second resonator cavity means to optimize power propagating at said second wavelength within said second resonator cavity means.

16. An optical parametric oscillator apparatus for generating an optical output beam, the apparatus comprising:

an optical pump means having an optical cavity for producing a first optical beam of a first wavelength;

a first resonator cavity means for supporting buildup of selected optical power at at least said first wavelength within said first resonator cavity means, said resonator cavity means being disposed in a position relative to said optical pump means to have an axis coincident with said first optical beam;

a first nonlinear crystal means in said first resonator cavity means which is phase matched for generating a second optical beam at a second wavelength which is at a harmonic multiple frequency to said first wavelength;

a second nonlinear crystal means in said first resonator cavity means for mixing said first optical beam and said second optical beam and producing a fifth optical beam at a fifth wavelength whose frequency is a linear combination of frequencies of said first wavelength and said second wavelength;

first mirror means for admitting said first beam at said first wavelength into said first resonator cavity means and for extracting a portion of said fifth beam at said fifth wavelength from said first cavity means;

first feedback means for controlling said optical pump means to optimize power at said first wavelength propagating within said first resonator cavity means;

a second resonator cavity means for supporting buildup of selected optical power at at least said fifth wavelength within said second resonator cavity means, said second resonator cavity means being disposed in a position relative to said first resonator cavity means to have an axis coincident with said second optical beam;

an optical parametric oscillator crystal means disposed within said second resonator cavity means for generating a third optical beam at a third wavelength and a fourth optical beam at a fourth wavelength upon excitation by said fifth optical beam at a power level per unit area above a threshold level, said third wavelength and said fourth wavelength being longer than said fifth wavelength;

second mirror means for admitting a portion of said fifth optical beam at said fifth wavelength into said second resonator cavity means and for extracting a portion of at least said fourth beam at said fourth wavelength from said second resonator cavity means; and feedback means for controlling length of said second resonator cavity means to optimize power propagating at said fifth wavelength within said second resonator cavity means.

17. An optical parametric oscillator apparatus for generating an optical output beam, the apparatus comprising:

an optical pump means having an optical cavity for producing a first optical beam of a first wavelength with a first free-running bandwidth;

a resonator cavity means for supporting buildup of selected optical power at at least said first wavelength within said first resonator cavity means, said resonator cavity means being disposed in a position relative to said optical pump means to have an axis coincident with said first optical beam;

an optical parametric oscillator crystal means disposed within said resonator cavity means for generating a second optical beam at a second wavelength and a third optical beam at a third wavelength upon excitation by said first optical beam at a power level per unit area above a threshold level, said second wavelength and said third wavelength being longer than said first wavelength;

a nonlinear crystal means in said first resonator cavity means which is phase matched for generating a fourth optical beam at a fourth wavelength whose frequency is a linear combination of frequencies of up to all of said beams of said first wavelength, said second wavelength and said third wavelength;

mirror means for admitting said first beam at said first wavelength into said resonator cavity means and for extracting a portion of said fourth beam at said fourth wavelength from said resonator cavity means;

feedback means for controlling said optical pump means to optimize power at said first wavelength propagating within said first resonator cavity means.

18. An optical parametric oscillator apparatus for generating an optical output beam, the apparatus comprising:

a first optical pump means for producing a first optical beam of a first wavelength with a first free-running bandwidth;

a second optical pump means for producing a second optical beam of a second wavelength with a second free-running bandwidth;

a resonator cavity means for supporting buildup of selected optical power at both said first wavelength and said second wavelength within said resonator cavity means, said resonator cavity means being disposed in a position relative to said first optical pump means and to said second optical pump means to have a first axis coincident with said first optical beam and a second axis coincident with said second optical beam;

a nonlinear crystal means in said resonator cavity means which is phase matched for mixing said first optical beam and said second optical beam to produce a third optical beam at a third wavelength whose frequency is a linear combination of frequencies of said first wavelength and said second wavelength;

mirror means for admitting said first beam at said first wavelength and said second beam at said second wavelength into said resonator cavity means and for extracting a portion of said third beam at said third wavelength from said resonator cavity means;

first feedback means for controlling said first optical pump means to optimize power at said first wavelength propagating within said resonator cavity means; and second feedback means for controlling said second optical pump means to optimize power at said second wavelength propagating within said resonator cavity means.

19. An apparatus for combining input optical beams, the apparatus comprising:

a first optical pump means for producing a first optical beam of a first wavelength with a first free-running bandwidth;

a second optical pump means for producing a second optical beam of a second wavelength nearly equal to said first wavelength;

a resonator cavity means for supporting buildup of selected optical power at said first wavelength within said resonator cavity means, said resonator cavity means being disposed in a position relative to said first optical pump means and to said second optical pump means to have a first axis coincident with said first optical beam and a second axis coincident with said second optical beam;

means disposed within said resonator cavity means for utilizing selected optical power;

mirror means for admitting said first beam at said first wavelength and said second beam at said second wavelength into said resonator cavity means;

first feedback means for controlling said first optical pump means to optimize power at said first wavelength propagating within said resonator cavity means; and second feedback means for controlling said second optical pump means to stabilize phase of said second beam injected into said resonator cavity means.

20. A method of generating oscillations parametrically as an optical output beam at a wavelength longer than an optical pump beam, the method comprising the steps of:

producing from an optical pump means having an optical cavity a first optical beam of a first wavelength with a first free-running bandwidth;

resonating said first optical beam in a resonator cavity means to build up selected optical power at at least said first wavelength within said resonator cavity means;

exciting an optical parametric oscillator crystal means disposed within said resonator cavity means with said first optical beam at a power level per unit area above a threshold level to generate a second beam at a second wavelength and a third beam at a third wavelength upon excitation by said first optical beam, said second wavelength and said third wavelength being longer than said first wavelength;

extracting a portion of at least said third beam at said third wavelength from said cavity means; and controlling said optical pump means via optical feedback derived from said resonator cavity means to optimize power at said first wavelength propagating within said resonator cavity means.

21. The method according to claim 20 wherein said controlling step comprises injecting a portion of said selected optical power into said optical pump means for optically frequency locking and stabilizing said first optical beam of said optical pump means.

22. The method according to claim 20 wherein said controlling step further comprises controlling phase of said first optical beam.

23. The method according to claim 20, wherein said controlling step includes adjusting center frequency of the gain curve of said optical pump means for expanding tuning range of said first optical beam.

24. An optical parametric oscillator apparatus for generating an optical output beam at a wavelength longer than an optical pump beam, the apparatus comprising:

an optical pump means including an optical cavity for producing a first optical beam of a first wavelength with a first free running bandwidth;

a resonator cavity means for supporting buildup of selected optical power at at least said first wavelength within said resonator cavity means, said resonator cavity means being disposed in a position relative to said optical pump means to have an axis coincident with said first optical beam;

an optical parametric oscillator crystal means disposed within said resonator cavity means for generating a second optical beam at a second wavelength and a third optical beam at a third wavelength upon excitation of said crystal means by said first optical beam at a power level per unit area above a predetermined threshold level, said second wavelength and said third wavelength being longer than said first wavelength;

mirror means for admitting said first beam at said first wavelength into said resonator cavity means and for extracting a first portion of at least said third beam at said third wavelength from said resonator cavity means; and feedback means for controlling said optical pump means to optimize power at said first wavelength propagating within said resonator cavity means, said feedback means including means for adjusting center frequency of the gain curve of said optical pump means for expanding tuning range of said first optical beam.

25. A method of generating oscillations parametrically as an optical output beam at a wavelength longer than an optical pump beam, the method comprising the steps of:

producing from an optical pump means having an optical cavity a first optical beam of a first wavelength with a first free-running bandwidth;

resonating said first optical beam in a resonator cavity means to build up selected optical power at at least said first wavelength within said resonator cavity means;

exciting an optical parametric oscillator crystal means disposed within said resonator cavity means with said first optical beam at a power level per unit area above a threshold level to generate a second beam at a second wavelength and a third beam at a third wavelength upon excitation by said first optical beam, said second wavelength and said third wavelength being longer than said first wavelength;

extracting a portion of at least said third beam at said third wavelength from said cavity means; and controlling said optical pump means via feedback derived from said resonator cavity means to optimize power at said first wavelength propagating within said resonator cavity means and adjusting center frequency of the gain curve of said optical pump means for expanding tuning range of said first optical beam.

26. An apparatus for generating an optical output beam, the apparatus comprising:

an optical pump means having an optical cavity for producing a first optical beam of a first wavelength with a first free-running bandwidth;

a resonator cavity means with a finesse sufficient for optical buildup at said first wavelength and at a second wavelength for supporting buildup of selected optical power at said first wavelength and at said second wavelength within said resonator cavity means, said resonator cavity means being disposed in a position relative to said optical pump means to have an axis coincident with said first optical beam;

a first nonlinear crystal means in said resonator cavity means which is phase matched for generating a second optical beam at said second wavelength whose frequency is a harmonic multiple to the frequency of said first wavelength;

a second nonlinear crystal means in said resonator cavity means for combining said first optical beam and said second optical beam and producing a third optical beam at a third wavelength whose frequency is a linear combination of frequencies of said first wavelength and said second wavelength;

mirror means for admitting said first beam at said first wavelength into said resonator cavity means and for extracting a portion of at least said third optical beam at said third wavelength from said cavity; and feedback means for controlling said optical pump means to optimize power at said first wavelength propagating within said resonator cavity means.

* * * * *